United States Patent [19]

Aina et al.

[11] Patent Number: 5,187,110

[45] Date of Patent: Feb. 16, 1993

[54] FIELD EFFECT TRANSISTOR-BIPOLAR TRANSISTOR DARLINGTON PAIR

[75] Inventors: Olaleye A. Aina, Columbia, Md.; Eric A. Martin, Nahant, Mass.

[73] Assignee: Allied-Signal Inc., Morris Township, Morris County, N.J.

[21] Appl. No.: 792,104

[22] Filed: Nov. 13, 1991

Related U.S. Application Data

[62] Division of Ser. No. 593,459, Oct. 5, 1990, Pat. No. 5,086,282.

[51] Int. Cl.⁵ .......................................... H01L 21/265
[52] U.S. Cl. ........................................ 437/34; 437/40; 437/44; 437/133; 148/DIG. 9
[58] Field of Search .................. 437/34, 44, 133, 40, 437/132; 148/DIG. 72, DIG. 9

[56] References Cited

U.S. PATENT DOCUMENTS

| | | | |
|---|---|---|---|
| 4,183,020 | 1/1980 | Schade, Jr. | 340/629 |
| 4,214,215 | 7/1980 | Mellen et al. | 330/277 |
| 4,216,393 | 8/1980 | Gillberg et al. | 307/270 |
| 4,241,314 | 12/1980 | Iwamatsu | 330/253 |
| 4,253,033 | 2/1981 | Redfern | 307/205 |
| 4,492,932 | 1/1985 | Rusznyak | 330/300 |
| 4,567,445 | 1/1986 | Berg | 330/300 |
| 4,581,590 | 4/1986 | Sunderland | 330/297 |
| 4,667,164 | 5/1987 | Doluca | 330/253 |
| 4,683,442 | 7/1987 | Vyne | 330/261 |
| 4,697,155 | 9/1987 | Lehning | 330/297 |
| 4,728,901 | 3/1988 | Pepper | 330/260 |
| 4,728,903 | 3/1988 | Reiffin | 330/264 |
| 4,746,627 | 5/1988 | Zuleeg | 437/34 |
| 4,757,276 | 7/1988 | Ishii et al. | 330/278 |
| 4,960,718 | 10/1990 | Aina | 437/22 |
| 4,980,303 | 12/1990 | Yamauchi | 140/DIG. 72 |
| 4,992,387 | 2/1991 | Tamura | 437/40 |
| 4,996,163 | 2/1991 | Sasaki | 437/5 |
| 4,996,166 | 2/1991 | Ohshima | 437/133 |
| 5,012,318 | 4/1991 | Honjo | 437/133 |
| 5,074,955 | 12/1991 | Henry et al. | 437/228 |

*Primary Examiner*—Brian E. Hearn
*Assistant Examiner*—Kevin M. Picardat
*Attorney, Agent, or Firm*—Donald B. Paschburg; Howard G. Massung

[57] ABSTRACT

A high frequency amplifying device comprises a field effect transistor-bipolar transistor darlington pair. Such a device combines the main desirable features of both field effect transistors and bipolar transistors, therefore, having a high input impedance that is typical of FETs and a high transconductance (or high current gain) which is typical of bipolar transistors.

3 Claims, 3 Drawing Sheets

FIELD EFFECT TRANSISTOR-BIPOLAR TRANSISTOR DARLINGTON PAIR

This application is a division of application Ser. No. 593,459, filed Oct. 5, 1990, now U.S. Pat. No. 5,086,282.

BACKGROUND OF THE INVENTION

1. Field of the Invention

The present invention relates to field effect transistors and bipolar transistors. More particularly the present invention relates to a device which combines the desirable features of both field effect transistors and bipolar transistors.

2. Description of the Prior Art

Si bipolar transistors and CMOS devices have been combined in integrated circuits (BiCMOS). This is discussed in an article entitled "Advanced BiCMOS Technology for High Speed VLSI", Ikeda T. et al., IEDM Conference Proceeding p. 408, 1986. The combination is motivated by a need to increase the speed of CMOS devices while reducing the power dissipation of Si bipolar devices for digital applications. Heterojunction bipolar transistors (HBTs) and heterojunction field effect transistors (HEMTs, HISHEMTs), based on III-V semiconducting compounds such as AlGaAs/GaAs and InP/InGaAs and AlInAs/InGaAs perform better than Si bipolar transistors and CMOS at high frequencies. This is discussed in articles entitled "High-Gain $Al_{0.48}In_{0.5}As/Ga_{0.53}As$ Vertical n-p-n Heterojunction Bipolar Transistors Grown by Molecular-Beam Epitaxy", Malik, R. J. et al., IEEE Electron Device Letters, EDL-4, 383, 1983 and "Self-Aligned AlGaAs/GaAs Heterojunction Bipolar Transistors with Improved High-Speed Performance", Chang et al., IEEE Device Research Conference, Santa Barbara, Calif., 1987. A bipolar transistor has a higher current gain and higher transconductance than a field-effect transistor, but its input impedance is much lower than that of the FET. A high current gain and transconductance results in superior high frequency performance. On the other hand, a high input impedance results in lower noise devices that are cascadable in multistage amplifiers. Therefore, a combination of HBTs and FETs in such a way as to take advantage of the best feature of both is desirable, but has not been proposed.

U.S. Pat. No. 4,214,215 by Mellen, A. J. and Reitlinger, A. discloses a low noise-high gain JFET amplifier for a piezoelectric transducer. A conventional transistor or Darlington pair is provided with a base electrode coupled to the source electrode of the JFET and a collector electrode coupled to the JFET drain electrode. The emitter circuit of the transistor includes a first voltage divider for feeding back a portion of the emitter signal to the base circuit of the transistor. A second voltage divider is provided in the feedback path from the first divider to the transistor base to apply a portion of the base feedback signal to the JFET gate through the gate input resistor.

U.S. Pat. No. 4,216,393 by Gillberg, J. E. and Kucharewski, N. discloses a drive circuit for controlling current output rise and fall times. This drive circuit has output current passing through at least one bipolar transistor. The rise and fall times of the output current are predetermined by controlling the rate of current change in the master path of a current mirror amplifier which has a separate slave path connected to supply base current for each bipolar transistor.

U.S. Pat. No. 4,241,314 by Iwamatsu, M. discloses a transistor amplifier circuit of the type wherein two pairs of circuits are used each including a source follower type field effect transistor in the input stage and a bipolar type transistor in the succeeding stage and wherein the paired bipolar transistors constitute a differential amplifier. A plurality of constant current sources are connected so that the sum of the currents flowing through respective transistors will be constant for the purpose of driving the field effect transistors with small voltage in an active region.

U.S. Pat. No. 4,253,033 by Redfren, T. P. discloses a wide bandwidth CMOS class A amplifier. In this circuit a CMOS inverter is coupled to drive a bipolar transistor emitter follower which has a field effect transistor load. The load transistor is provided with a d.c. bias that causes the circuit to function as a class A amplifier. The amplifier has a gain-band-width product that is much higher than can be achieved with CMOS invertors alone and such amplifiers can be cascaded to achieve extremely high gain values.

U.S. Pat. No. 4,492,932 by Rusznyak, A. discloses an amplifier circuit having a high impedance input and a low impedance output. This circuit includes an input field effect transistor connected in a source-follower configuration, a bipolar transistor connected in an emitter-follower configuration and controlled by the transistor, a current source serving as a load for the transistor, an amplifier being controlled by the transistor and a resistor which serves as a load for the transistor and which connects the source of the transistor to the output of the amplifier. This output also serves as the output of the circuit which is supplied by a voltage source applied between the current source and the collector of the transistor. The d.c. voltage drop in the resistor is low which permits the circuit to be supplied at a low voltage and to dissipate a small amount of energy.

The patents listed above are related to the present invention, however, the above designs will not work at high frequencies. The patents above that describe the method of fabrication disclose that the circuits will be implemented with only low frequency silicon-based devices. The present invention, however, overcomes the low frequency limitation and other deficiencies by providing a field effect transistor-heterojunction bipolar transistor pair that operates at high frequencies.

SUMMARY OF THE INVENTION

The present invention combines the main desirable features of both field effect transistors (FETs) and bipolar transistors therefore having a high input impedance that is typical of FETs and a high transconductance (or high current gain) which is typical of bipolar transistors. The FET-Bipolar darlington pair is most useful in applications where a high input impedance and output conductance is desirable. These applications include high gain low noise amplifiers, cascadable gain blocks, high frequency optocouplers and power sources. When implemented with a p-channel MISHEMT or MISFET and a heterojunction bipolar transistor (HBT) for example, this device can be used in high speed and millimeter wave circuits.

DETAILED DESCRIPTION OF THE INVENTION

A bipolar transistor has a higher current gain and higher transconductance than a field effect transistor but the input impedance of the former is much lower than that of the field effect transistor (FET). A high current gain and transconductance results in superior high frequency performance. On the other hand, a high input impedance results in lower noise devices that are cascadable in a multistage amplifiers. Using a FET to drive a bipolar transistor in a darlington combination should yield a device with both high gain and high input impedance.

Figure 1:
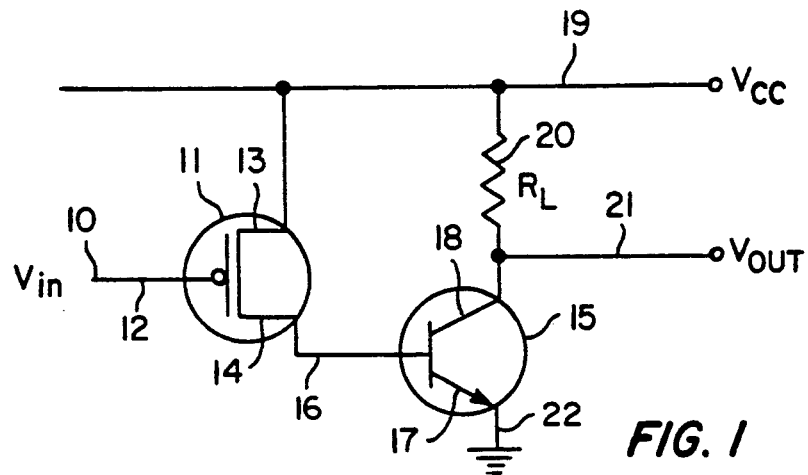
FIG. 1 illustrates a circuit diagram of a FET-HBT darlington pair.

FIG. 1 illustrates a circuit diagram of a field effect transistor (FET)-heterojunction bipolar transistor (HBT) darlington pair. The FET and HBT must both be of a first conductivity type. As an example, if an npn HBT is utilized, the FET should be a p-channel MISFET, MESFET, HEMT or MISHEMT. If a pnp HBT is utilized, the FET should be n-channel. Otherwise, there will be p/n junctions which will degrade device performance. In FIG. 1, the input signal $V_{in}$ 10 is coupled directly to gate 12 of FET 11. The drain terminal 13 of FET 11 is coupled to the positive supply terminal $V_{cc}$ 19. The amplified signal output is retrieved from a source terminal 14 of FET 11 and is coupled to the base 16 of HBT 15. The emitter 17 of HBT 15 is coupled to ground 22. The collector 18 of HBT 15 is coupled to the drain 13 of FET 11 through load resistor ($R_L$) 20. Collector 18 is also coupled to $V_{out}$ 21. When voltage is applied at $V_{in}$ 10, FET 11 is turned on and source-drain current of FET 11 supplies the base current for HBT 15 which is then turned on. Because HBT 15 has a fixed turn-on voltage, this entire FET-HBT darlington pair has the advantage of a nearly fixed turn-on voltage which is not typical of FETs.

Figure 2:
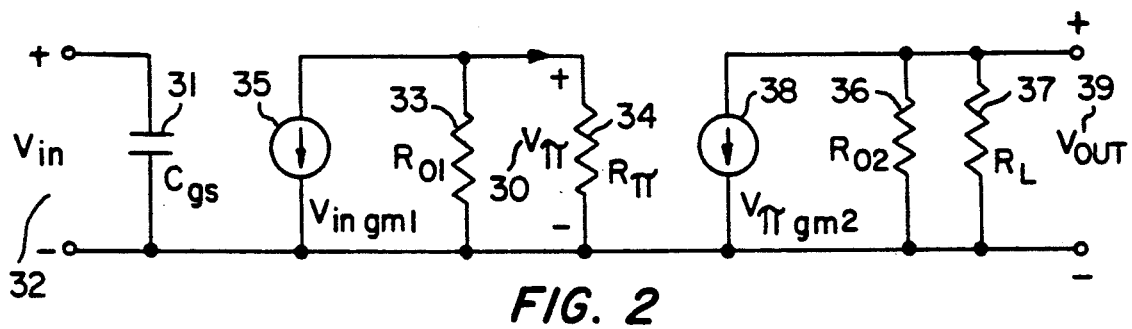
FIG. 2 illustrates an equivalent circuit for the FET-HBT darlington pair when in an inverter configuration.

FIG. 2 illustrates an equivalent circuit for the FET-HBT darlington pair illustrated in FIG. 1 when in an inverter configuration. From FIG. 2, we see capacitor gs ($C_{gs}$) 31 across the positive and negative terminals of the input voltage ($V_{in}$) 32. Resistors $R_{01}$ 33 and $R_\pi$ 34 are in parallel with $V_{in} g_{m1}$ 35. FIG. 2 also illustrates resistors $R_{02}$ 36 in parallel with $R_L$ 37 and $V_\pi g_{m2}$ 38.

The equations representing $V_\pi$ 30 and $V_{out}$ 39 of the equivalent circuit illustrated in FIG. 2 are as follows.

$$V_\pi = -V_{in} g_{m1} (R_{01} \text{ in parallel with } R_\pi) \quad (1)$$

$$V_{out} = -V_\pi g_{m2} (R_{02} \text{ in parallel with } R_L) \quad (2)$$

$$V_{out}/V_{in} = g_{m1} g_{m2} (R_{01} \text{ in parallel with } R_\pi)(R_{02} \text{ in parallel with } R_L) \quad (3)$$

$$\text{For } R_{01} = R_{02} \rightarrow \infty \quad B_0 = R_\pi g_m \quad 4.$$

-continued $$V_{out}/V_{in} = g_{m1} B_0 R_L$$

$$g_{meff} = B_0 g_{m1}$$

The approximations contained in the above results are those valid for normal transistor operation. For unusual conditions, the exact formulation for the terminal parameters should be used.

The equivalent circuit illustrated in FIG. 2 shows that the effective transconductance of the FET-HBT darlington pair is the product of the transconductance of the FET and the current gain of the HBT. Correspondingly, the input impedance of the FET-HBT darlington pair is equal to that of the FET.

Because InP/InGaAs is among the best heterojunction pairs for HBTs we will now illustrate the fabrication of one embodiment of the present invention using InP/InGaAs HBTs and InP/InGaAs MISFETs. Other material combinations such as AlGaAs/GaAs, AlInAs/InGaAs, AlInAs/InP and GaInP/GaAs can also be used for the HBT and corresponding FETs such as MESFETs, J-FETs, HEMTs and MISHEMTs can be used.

Figure 3:
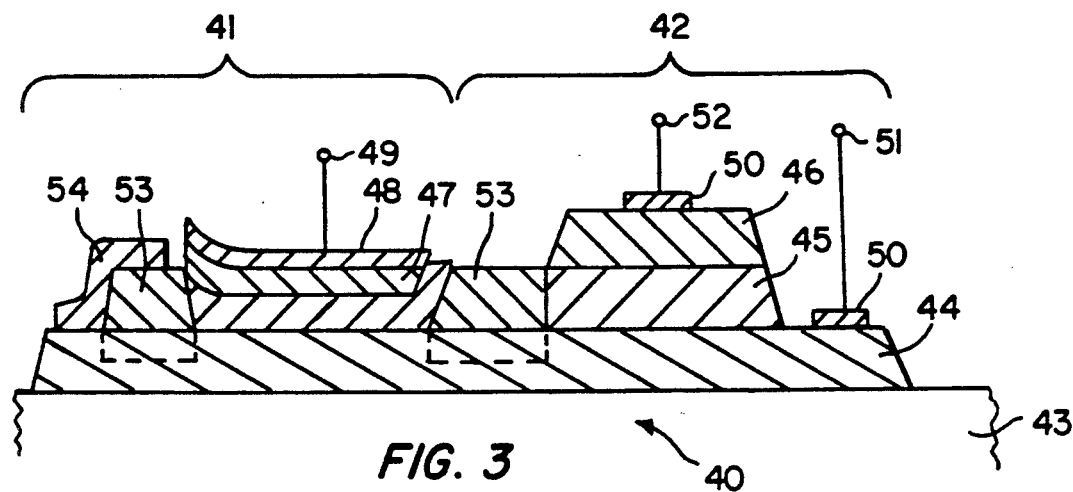
FIG. 3 illustrates the fabrication sequence for one embodiment of the present invention.

FIG. 3 illustrates the fabrication sequence for the InP/InGaAs FET-HBT darlington pair 40 having an inversion mode MISFET as the FET input. Conventional processing techniques for HBTs and FETs can be used to realize the device. As shown in the embodiment illustrated in FIG. 3, a p-MISFET 41 and a npn HBT 42 are combined on a semi-insulating InP substrate 43 which has an n-type InP active region 44 formed thereon by implanting silicon (Si). Indium phosphide (InP) is a widely used substrate for MISFETs; however, it is to be understood that the method of the present invention is applicable to MISFETs formed on substrates comprising any suitable group III-V compound semiconductor. In particular, gallium arsenide (GaAs) gallium aluminum arsenide (GaAlAs) and gallium phosphide (GaP) are all suitable materials for the substrate 43. The active region 44 may be formed by conventional methods such as ion implantation followed by annealing, or by epitaxial growth if the active region 44 can be lattice matched with the substrate 43. The substrate 43 may be the supporting structure for a plurality of devices, and thus the individual devices are electrically isolated by implanting isolation regions (not shown) in the substrate 43 and the active region 44, or by mesa etching (not shown). Above the active region 44 lies a p+type InGaAs layer 45 and above this layer lies an n-type InP layer 46 as well as an SiO$_2$ layer 47. Above the SiO$_2$ layer 47 is a TiAu layer 48 from where $V_{in}$ 49 taps off. AuGeNi 50 is located above the active region 44 and provides a tap off for ground 51. AuGeNi 50 is also located above the n-type InP layer 46 and provides a tap off for $V_{cc}$ 52. Also illustrated in FIG. 3 are the p+ implant areas 53, with one of those areas partially covered by a AuZnNi layer 54. As can be seen from the illustration, the implanted p+ source-drain feeds current to the base of the HBT.

Figure 4:
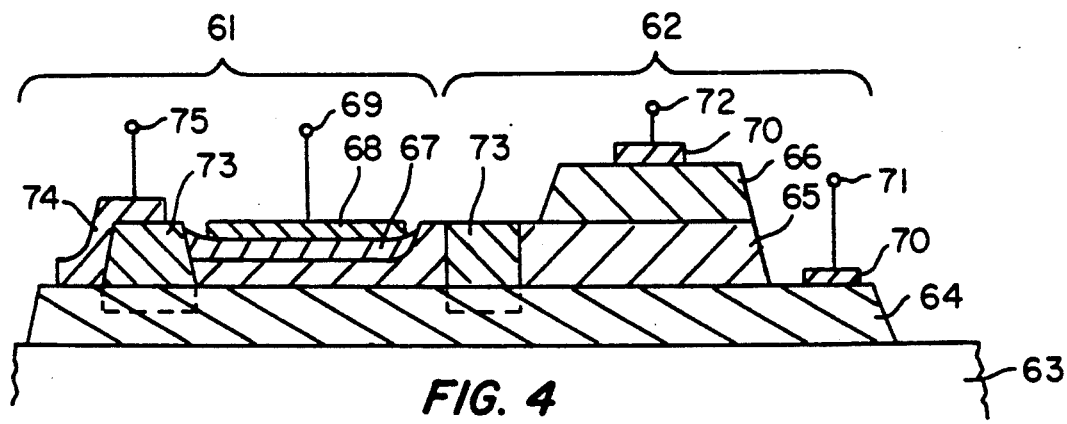
FIG. 4 illustrates the fabrication sequence for another embodiment of the present invention.

FIG. 4 illustrates the fabrication sequence for the InP/InGaAs FET-HBT darlington pair 60 having a p+ channel MISFET as the FET input. Once again, conventional processing techniques for HBTs and FETs can be used to realize the device. As shown in the embodiment illustrated in FIG. 4, a p+ MISFET 61 and a npn HBT 62 are combined on a semi-insulating InP substrate 63 which has an n-type InP active region 64 formed thereon. Above the n-type InP active region 64 lies a p+ type InGaAs layer 65 and above this layer lies an n-type InP layer 66 as well as an SiO$_2$ layer 67. Above the SiO$_2$ layer 67 is a TiAu layer 68 from where V$_{in}$ 69 taps off. AuGeNi 70 is located above the active region 64 and provides a tap-off for ground 71. AuGeNi 70 is also located above the n-type InP layer 66 and provides a tap-off for V$_{cc}$ 72. Also illustrated in FIG. 4 are the p+ implant areas 73, with one of those areas partially covered by a AuZnNi layer 74 which provides a pickoff for V$_{cc}$75 of the MISFET 61. As can be seen from this illustration and as indicated in FIG. 3, the implanted source-drain feeds current to the base of the HBT. The differences between FIGS. 3 and 4, inversion mode MISFET as the FET input versus the p+channel MISFET as the FET input is that whereas the former is capable of higher frequency performance, the latter is capable of higher current drive because it has a more highly doped channel.

Figure 5:
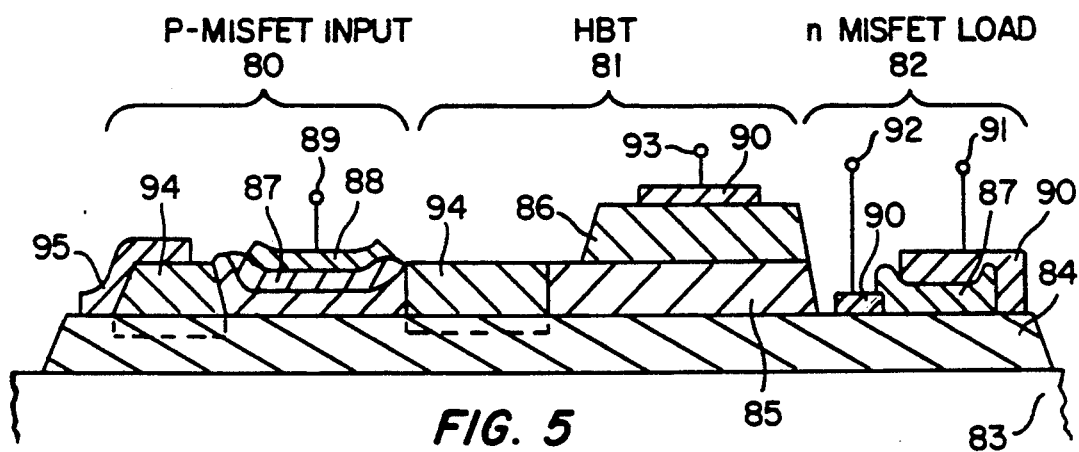
FIG. 5 illustrates an application of the present invention as millimeter-wave gain blocks having an active load.

FIG. 5 illustrates a possible application of this invention as millimeter-wave gain blocks with active loads. As shown in the embodiment illustrated in FIG. 5, a p-MISFET 80 input lies adjacent to a HBT 81 which is adjacent to an n-MISFET load 82 therefore forming an HBT gain stage with an FET input and an active load. As illustrated in FIGS. 3 and 4, a semi-insulating InP substrate 83 has an n-type InP active region 84 formed thereon. Above the active region 84 lies a p+type InGaAs layer 85 and above this layer lies an n-type InP layer 86 as well as an SiO$_2$ layer 87. Above the SiO$_2$ layer 87 is a TiAu layer 88 from where V$_{in}$ 89 taps off. A second layer of SiO$_2$ 87 is located above the n-type InP active region 84. AuGeNi 90 is located above the active region 84 near the second layer of SiO$_2$ layer 87 and provides a pickoff for V$_{oo}$ 91 and V$_{out}$ 92. AuGeNi 90 is also located above the n-type InP layer 86 and provides a tap-off for V$_{EE}$ 93. Also illustrated in FIG. 5 are the p+ implant areas 94 with one of those areas partially covered by a AuZnNi layer 95. Once again conventional processing techniques for HBTs and FETs can be used to realize this device.

Figure 6:
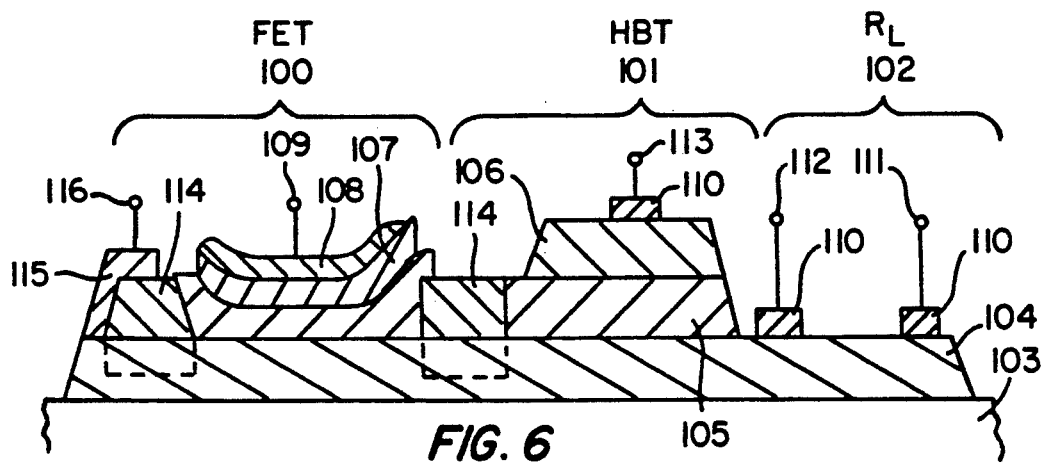
FIG. 6 illustrates an application of the present invention as millimeter-wave gain blocks having a passive load.

FIG. 6 illustrates a possible application of this invention as millimeter-wave gain blocks with passive loads. As shown in the embodiment illustrated in FIG. 6, a FET 100 lies adjacent to a HBT 101 which is adjacent to a load (R$_L$) 102 therefore forming a non-inverting gain block with a passive load. As discussed earlier a semi-insulating InP substrate 103 has an n-type InP active region 104 formed thereon. Above the active region 104 lies a p+type InGaAs layer 105 and above this layer lies an n-type InP layer 106 as well as an SiO$_2$ layer 107. Above the SiO$_2$ layer 107 is a TiAu layer 108 from where V$_{in}$ 109 taps off. AuGeNi 110 is located at several locations above the active region 104 and provides a pickoff for V$_{cc}$ 111 and V$_{out}$ 112. AuGeNi 110 is also located above the n-type InP layer 106 and provides a tap-off for V$_{EE}$ 113. Also illustrated in FIG. 6 are the p+ implant areas 114 with one of those areas partially covered by a AuZnNi layer 115 which provides a pickoff for V$_{cc}$ 116 of the FET 100. The difference between FIGS. 5 and 6, millimeter-wave gain blocks with active loads versus millimeter-wave gain blocks with passive loads is the use of FETs or other active devices as the load for the former. Active loads are better suited for low frequency operation whereas passive loads work better at the highest frequencies where the tuning requirements are too stringent for active loads. In general, however, active loads have better large signal performance and are, therefore, more suited for digital and power applications.

Figure 7:
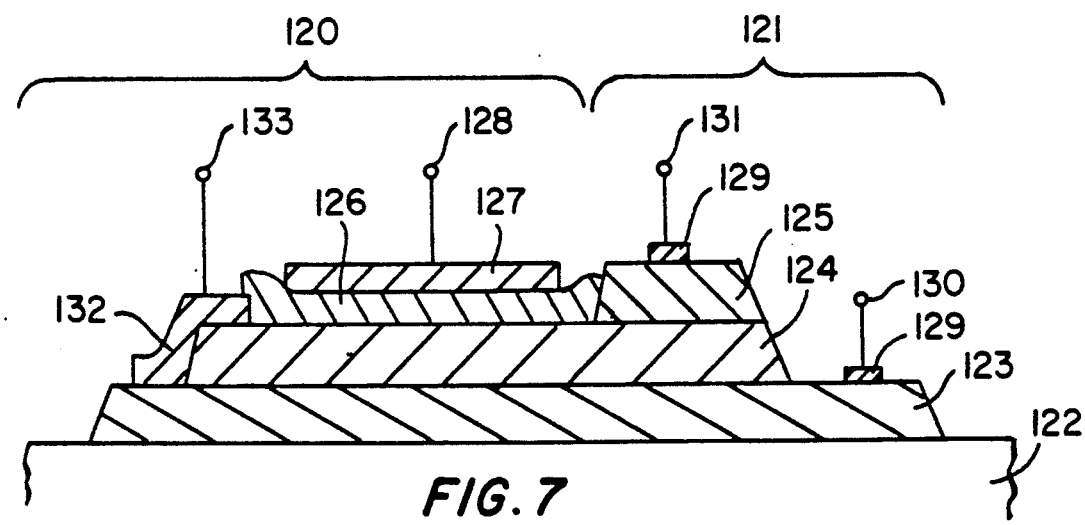
FIG. 7 illustrates the fabrication sequence for a third embodiment of the present invention.

FIG. 7 illustrates a FET-HBT Darlington pair having a depletion-mode FET input. This embodiment differs from the earlier embodiment in that there is no need for a p-implant. As shown in the embodiment illustrated in FIG. 7, a p MISFET input 120 lies adjacent to a HBT 121 with the depletion mode MISFET 120 driving the base of the HBT 121. A semi-insulating InP substrate 122 has an n-type InP active region 123 formed thereon. Above the n-type InP active region 123 lies a p+type InGaAs layer 124 and above this layer lies an n-type InP layer 125 as well as an SiO$_2$ layer 126. Above the SiO$_2$ layer 126 is a TiAu layer 127 from where V$_{in}$ 128 taps off. AuGeNi 129 is located above the active region 123 and provides a pickoff for ground 130. AuGeNi 129 is also located above the n-type InP layer 125 and provides a tap-off for V$_{cc}$ 131. Also illustrated in FIG. 5 is an AuZnNi layer 132 which lies adjacent to and partially over the p+type InGaAs layer 124 and provides a pickoff for V$_{cc}$ 133 of the MISFET 120.

It is not intended that this invention be limited to the hardware arrangement, or operational procedures shown disclosed. This invention includes all of the alterations and variations thereto as encompassed within the scope of the claims as follows.

We claim:

1. A method of fabricating a high frequency amplifying device comprising the steps of:
   forming a semi-insulating InP substrate having an n-type InP active region formed thereon from any suitable group III–V compound semi-conductor;
   combining a p-channel MISFET and a n-p-n HBT on said semi-insulating substrate;
   electrically isolating said p-channel MISFET and said n-p-n HBT by implanting isolation regions in said active region;
   forming a p+ type InGaAs layer above said active region;
   forming an n-type InP layer and an SiO$_2$ layer above said p+ type InGaAs layer;
   forming a TiAu layer above said SiO$_2$ layer and providing a terminal for V$_{in}$;
   forming an AuGeNi layer above said active region, and providing a terminal for ground; and
   forming an AuGeNi layer above said n-type InP layer and providing a terminal for V$_{cc}$.

2. A method as claimed in claim 1 comprising the step of forming said active region by ion implantation followed by annealing.

3. A method as claimed in claim 1 comprising the step of forming said active region by Epitaxial growth.

* * * * *